(12) United States Patent
Reynolds

(10) Patent No.: US 8,790,801 B2
(45) Date of Patent: Jul. 29, 2014

(54) INTEGRATED ELECTROCHEMICAL AND SOLAR CELL

(75) Inventor: Glyn J. Reynolds, Largo, FL (US)

(73) Assignee: Oerlikon Advanced Technologies AG, Balzers (LI)

( * ) Notice: Subject to any disclaimer, the term of this patent is extended or adjusted under 35 U.S.C. 154(b) by 1159 days.

(21) Appl. No.: 12/204,338

(22) Filed: Sep. 4, 2008

(65) Prior Publication Data

US 2009/0065042 A1     Mar. 12, 2009

Related U.S. Application Data

(60) Provisional application No. 60/970,645, filed on Sep. 7, 2007.

(51) Int. Cl.
| H01M 12/00 | (2006.01) |
| H01M 6/18 | (2006.01) |
| H01L 31/00 | (2006.01) |
| H01L 31/042 | (2014.01) |

(52) U.S. Cl.
USPC ............... 429/9; 429/304; 429/322; 136/243; 136/244; 136/252

(58) Field of Classification Search
CPC ........... H01L 27/1423; H01L 31/0586; H01M 10/0562; H01M 10/0561
USPC ..................... 429/111, 208, 209, 9, 304, 322; 136/244, 251, 291, 293, 243, 252
See application file for complete search history.

(56) References Cited

U.S. PATENT DOCUMENTS

| 4,352,768 A * | 10/1982 | Epstein ........................ 264/105 |
| 4,481,265 A | 11/1984 | Ezawa et al. |
| 4,740,431 A | 4/1988 | Little |
| 5,338,625 A | 8/1994 | Bates et al. |
| 5,445,906 A | 8/1995 | Hobson et al. |
| 5,561,004 A | 10/1996 | Bates et al. |
| 5,569,520 A * | 10/1996 | Bates ........................... 429/162 |
| 5,644,207 A | 7/1997 | Lew et al. |
| 5,866,275 A * | 2/1999 | Kawasaki et al. ............. 429/479 |
| 6,005,183 A | 12/1999 | Akai et al. |
| 6,168,884 B1 | 1/2001 | Neudecker et al. |
| 6,309,906 B1 | 10/2001 | Meier et al. |
| 6,805,998 B2 | 10/2004 | Jenson et al. |
| 6,986,965 B2 | 1/2006 | Jenson et al. |
| 7,131,189 B2 | 11/2006 | Jenson |
| 7,150,938 B2 | 12/2006 | Munshi et al. |
| 2003/0127126 A1 * | 7/2003 | Yang ............................ 136/251 |
| 2003/0188776 A1 | 10/2003 | Li et al. |
| 2004/0185310 A1 | 9/2004 | Jenson et al. |
| 2005/0045223 A1 | 3/2005 | Jenson et al. |
| 2006/0286448 A1 * | 12/2006 | Snyder et al. .................. 429/176 |
| 2007/0054188 A1 * | 3/2007 | Miller et al. ............... 429/218.1 |
| 2007/0087230 A1 | 4/2007 | Jenson et al. |
| 2007/0181175 A1 | 8/2007 | Landis |
| 2007/0277876 A1 | 12/2007 | Huang et al. |

* cited by examiner

Primary Examiner — Muhammad Siddiquee
(74) Attorney, Agent, or Firm — Harvey S. Kauget; Burr & Forman LLP

(57) ABSTRACT

The present invention provides a method and apparatus for providing an integrated electrochemical and solar cell. In one embodiment of the invention, an electrochemical cell with a self supporting ceramic cathode layer is electrically connected to a solar cell. In another embodiment of the invention, an electrochemical cell with a self supporting anode is provided. The present invention also contemplates methods of manufacturing the integrated electrochemical and solar cell wherein such methods provide weight savings and streamlined manufacturing procedures through the use of self supporting cathodes and anodes.

2 Claims, 8 Drawing Sheets

INTEGRATED ELECTROCHEMICAL AND SOLAR CELL

CROSS REFERENCES TO RELATED APPLICATIONS

This application claims priority from and is related to commonly owned U.S. Provisional Patent Application Ser. No. 60/970,645 filed Sep. 7, 2007, entitled: Integrated Solar Cell and Solid-State Battery, this Provisional Patent Application is incorporated by reference herein.

FIELD OF THE INVENTION

The present invention generally relates to solar cells and thin film batteries, and in particular to an improved design for an integrated electrochemical and solar cell and method of producing the same.

BACKGROUND OF THE INVENTION

The area of thin film batteries, particularly those employing lithium, has seen great advances over the past several decades. In addition, the recent increases in the price of conventional energy production have focused attention on alternative energy sources. In particular, the photovoltaic solar cell has been improved significantly and its cost has been reduced. At the same time, prices for fossil fuels have risen to the point where it is projected that solar power will be comparable in cost to grid power by 2010. Today's second generation solar cells based on thin films of amorphous and microcrystalline silicon deposited on large glass substrates offer the most promise to achieve cost parity to grid power within a few years.

A limitation of photovoltaic devices is that they are only able to provide power when illuminated. This requires devices that must operate at other times to have an alternative source of power. In the case of mobile electronics, automobiles, etc. that cannot conveniently be plugged into mains outlets, the simplest form of backup power is an electrochemical cell or battery. Electrochemical cells provide an excellent combination of energy capacity, power density and economy. Some cell designs can be recharged many times—so-called secondary batteries. Currently, thin-film lithium batteries offer the best performance in terms of energy density, power density and cycle life. Like the second generation solar cells, they are also fabricated using thin-film deposition techniques.

Many individuals have made prior attempts to provide solutions and improvements to the issues surrounding the design and production of photovoltaic cell/thin film battery combinations. For example, in 1984, U.S. Pat. No. 4,481,265 was issued to Ezawa et al. describing a "Photovoltaic-Storage Battery Device." This patent disclosed an insulating substrate with photovoltaic cells on one side and a battery on the opposite side, though the inventors also described how both devices could be incorporated onto the same surface. The description of the device described a battery that used a liquid electrolyte but their claims include a battery that includes an inorganic film electrolyte. In 1984, the then state-of-the-art solid-state batteries provided far inferior performance to batteries with liquid electrolytes. It was left to the reader to determine how to fabricate the all solid-state device and what materials to use. The overall manufacturing method described was complicated and inelegant.

In 1988, U.S. Pat. No. 4,740,431 granted to Little described a far more elegant and practical method for fabricating an integrated solar cell and battery. This inventor disclosed a process whereby a solar cell and a battery were deposited solely by depositing and patterning thin films onto a substrate using techniques pioneered in the semiconductor industry. At that time, glasses based on lithium sulfide appeared to be the most promising solid-state electrolytes for all solid-state batteries.

However, in 1994, Bates et al. described a superior solid state electrolyte based on lithium phosphorus oxynitride (Li-PON) and were granted U.S. Pat. No. 5,338,625. In addition to disclosing the new thin-film solid state electrolyte material, the authors claimed a thin film battery that they described as a thin-film microbattery and that was deposited using thin-film deposition methods. Following this pivotal discovery, many inventors were granted patents that sought to improve various aspects of the thin-film microbattery.

There were at least two major drawbacks to the thin-film microbattery disclosed by Bates (and also common to the battery described by Little) which stemmed from the fact that the battery was fabricated entirely from thin-films deposited onto a substrate that was not electrochemically active. First, the capacity per unit area of the disclosed thin-film batteries is very low because the electrodes are very thin. Second, the fabrication cost is very high compared to batteries fabricated from bulk materials due to the need for expensive vacuum deposition equipment.

An innovative way to solve the problem of poor capacity was proposed by Hobson and Snyder in U.S. Pat. No. 5,445,906 (issued 1995) whereby the films were deposited onto a large area flexible substrate in a web coater. The substrate was then wound into a tight spiral, thereby achieving large capacity per unit volume. However, use of a web coater further increases the manufacturing costs and the use of a tightly wound spiral battery is not easily integrated with a large planar thin-film solar cell.

More recently Jenson, in U.S. Patent Application No. US 2004/0185310, has disclosed a "Method and Apparatus for Integrated Battery-Capacitor Devices" which attempts to provide an integrated battery-device solution. The Jenson reference teaches depositing the battery onto a conductive substrate layer which is a separate structural component from the battery. Jenson also discloses integrating the proposed battery with a photovoltaic cell, although all permutations taught include the use of a substrate which is a separate and distinct structural component from the battery.

Thus, although the Jenson reference touches on both thin film batteries and photovoltaic cells, it fails to embrace the invention contained herein: a thin film battery with a self supporting cathode or anode layer which can be more easily and economically manufactured than the batteries present in the prior art. In one embodiment of the present invention, the self supporting layer is significantly thicker (on the order of 50 times) than previously taught resulting in dramatic increases in the capacity per unit area of the cell as compared to traditional thin film cells. Additionally, the addition of an integrated solar cell in the present invention provides an elegant solution to design issues present in thin film battery evolution while saving space, weight and increasing speed and ease of manufacture.

BRIEF SUMMARY OF THE INVENTION

The present invention discloses an integrated electrochemical and solar cell. The integrated cell contains an electrochemical cell and a solar cell. The electrochemical cell comprises a cathodic current collector; a self supporting ceramic cathode layer, an anode layer, an anodic current collector and a solid electrolyte layer with the solid electrolyte layer disposed between the cathode layer and the anode layer. The solar cell is of a type known in the art and is electrically connected to the self supporting electrochemical cell of the invention.

The present invention also discloses a method of manufacturing an integrated electrochemical and solar cell. A preferred embodiment of the disclosed method provides for an electrochemical cell formation process comprising the steps of fabricating a non-supportive cathodic current collector layer on a ceramic self-supporting cathode layer, forming a solid electrolyte layer on the ceramic self supporting cathode layer, forming an anode layer onto the electrolyte layer, fabricating an anodic current collector layer onto the anode layer, and depositing an encapsulation layer onto the anodic current collector layer. An embodiment of the invention further contains a solar cell formation process comprising the steps of depositing photovoltaic materials onto a supportive glass layer and an integration step comprising the step of connecting said photovoltaic materials to said non-supportive cathodic current collector layer.

The foregoing has outlined rather broadly the more pertinent and important features of the present invention in order that the detailed description of the invention that follows may be better understood so that the present contribution to the art can be more fully appreciated. Additional features of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

Similar reference characters refer to similar parts throughout the several views of the drawings.

DETAILED DESCRIPTION OF THE INVENTION

Figure 1:
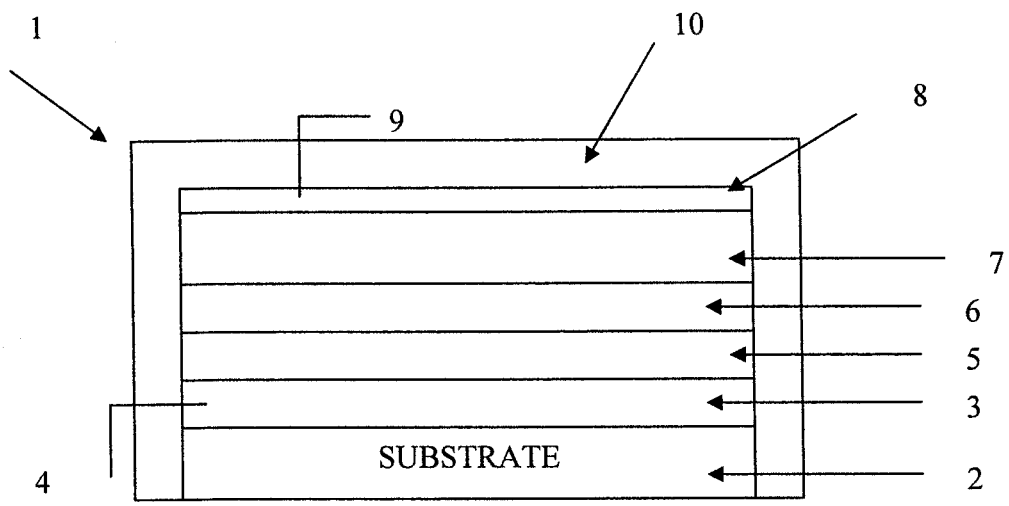
FIG. 1 is a cross sectional view of a typical thin film electrochemical cell as known in the art.

Typically, thin film electrochemical cells (such as thin film lithium batteries) are manufactured by depositing various layers of material onto a base layer, or substrate. FIG. 1 illustrates the typical design of a prior art-type thin film battery 1. In the prior art, the substrate 2 can be made from various materials such as metal foil, glass or a thin plastic film. The substrate 2 is then typically placed into a deposition machine, such as Physical Vapor Deposition (PVD), Plasma Enhanced Chemical Vapor Deposition (PECVD) or Chemical Vapor Deposition (CVD) equipment or the like. The cathodic current collector 3 is first deposited onto the substrate 2. Additionally, a cathodic circuit connector 4 is fabricated. Following the deposition of the cathodic current collector 3, the cathode layer 5 is deposited. With lithium thin film batteries, lithium cobalt oxide ($LiCoO_2$) is a preferred cathode material, although other materials such as $LiMn_2O_4$, $LiFePO_4$, or others known to those skilled in the art can be utilized. Techniques such as sputtering are commonly used to deposit the cathode material onto the cathodic current collector 3. Although effective, sputtering has physical limitations as to the maximum thickness of the layer which can be deposited. Typically, sputtered layers are not more than 10 microns (10 µm) thick.

Once the cathode layer 5 is deposited on the substrate 2, an electrolyte layer 6 is deposited onto the cathode layer 5. In the prior art example shown in FIG. 1 for a lithium thin film battery, the electrolyte material is lithium phosphorus oxynitride (LiPON). Typically, in lithium thin film batteries, the electrolyte layer will be on the order of one micron (1 µm) thick. Next, the anode layer 7 is deposited on top of the electrolyte layer 6 followed by an anodic current collector 8 followed by the fabrication of an anodic circuit connection 9. To complete the production of the prior art lithium thin film battery, an encapsulation layer 10 is applied over the cell 1 in order to prevent the introduction of moisture. In the example shown in FIG. 1, the anode layer 7 can be lithium metal or a lithium alloy. As shown in FIG. 1, the prior art's design and manufacturing process for electrochemical cells is complex and involves one structural component and multiple deposition steps. Thus, there exists a need for a simplified design and method of manufacturing an electrochemical cell. There further exists a need for a simplified design and method of manufacturing an integrated electrochemical and solar cell in order to increase the storage capacity per unit cost of the electrochemical cells and to leverage the current storage potential of electrochemical cells with advances in solar cell technology.

Figure 2:
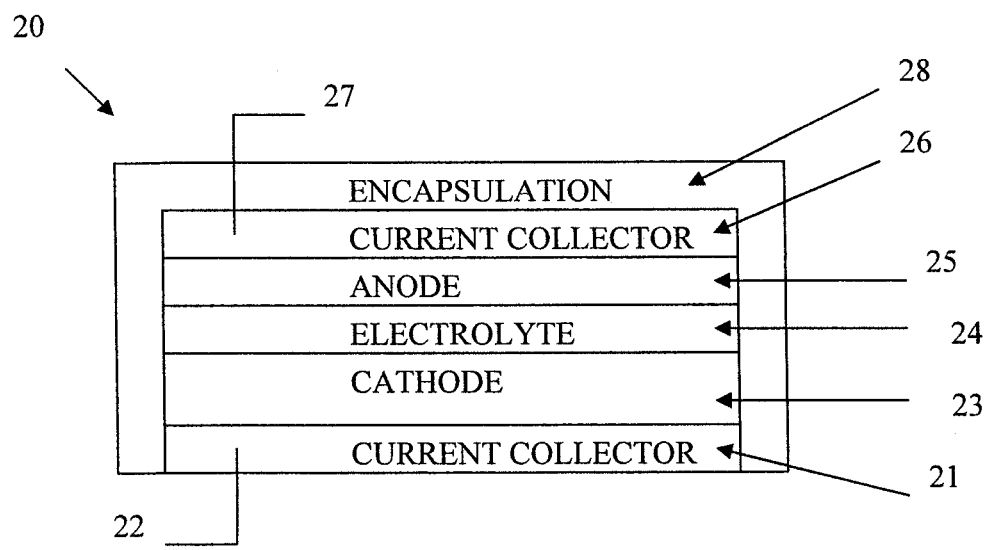
FIG. 2 is a cross sectional view of a self supporting electrochemical cell as taught by the present invention.

FIG. 2 shows an embodiment of a self supporting electrochemical cell 20 of the type contemplated by the current invention. Although the description herein makes references to lithium cells, this invention contemplates using a variety of materials separate and apart from lithium and lithium-related electrochemical cells. In contrast with the electrochemical cells of the prior art, the current invention provides for a self supporting cathode layer upon which the remaining electrochemical cell structure is then fabricated. Thus, the current invention eliminates the need for a separate substrate layer thereby saving space and manufacturing costs.

In an embodiment of the present invention, a self supporting cathode layer 23 is first formed of a suitable ceramic cathode material and selected additives depending on the electrical characteristics desired. In an embodiment of the present invention, $LiCoO_2$ is used as the cathode material although as understood by those skilled in the art any suitable cathode material can be utilized without deviating from the spirit and intent of the current invention. Examples of suitable cathodic materials include metal oxides, lithium containing metal oxides, metal phosphates, lithium containing metal phosphates, metal sulfides, lithium containing metal sulfides, metal oxysulfides, lithium containing metal oxysulfides, selenides, mixtures of metal oxides (e.g., $V_2O_5$—$TeO_2$), etc.

In another embodiment of the present invention, additional electrolyte materials such as lithium silicates (drawn from the $Li_2O$—$SiO_2$ pseudo-binary), lithium phosphates (drawn from the $Li_2O$—$P_2O_5$ pseudo-binary), lithium zirconates (drawn from the $Li_2O$—$ZrO_2$ pseudo-binary), and ionically conductive glasses as well as electrically conductive materials such as graphite can be added to the cathode material during processing to enhance the ionic and electronic conductive properties and overall performance of the self supporting ceramic cathode layer 23. These additives have the benefit of allowing the self supporting electrochemical cell 20 to more fully utilize the entire thickness of cathode material for the charge-recharge cycle.

In a preferred embodiment of the present invention, the self supporting ceramic cathode layer 23 is formed with a thickness of approximately 0.5-1.0 mm. Ceramic cathode layer 23 thicknesses of less than 0.5 mm or greater than 1.0 mm can also be used within the ambit of the present invention without deviating from its spirit or intent.

Following the fabrication of the self supporting cathode layer 23, a cathodic current collector 21 can be applied to one of the self supporting cathode layer's 23 major surfaces. The cathodic current collector 21 is typically applied via sputtering, but other deposition techniques as known in the art are suitable. The cathodic current collector 21 can be made from nickel or any other material suitable for transferring electric current from the cell's cathode to an external circuit such as gold, aluminium, etc.

Following the deposition of the cathodic current collector 21, cathodic circuit connection 22 can be fabricated. Cathodic current connection 22 can be a wire, circuit or other connection device used to connect the cathodic current collector 21 to an external circuit. On the opposite major surface of the self supporting cathode layer 23, an electrolyte layer 24 is deposited.

In a preferred embodiment, the electrolyte layer 24 can be deposited via sputtering; however, it is also contemplated that other deposition techniques such as chemical vapor deposition (CVD), plasma-enhanced chemical vapor deposition (PECVD), atomic layer deposition (ALD), pulsed laser deposition (PLD), plasma spraying, etc., can be employed. In a preferred embodiment, LiPON is used as the electrolyte material, but other suitable electrolyte materials which are apparent to those skilled in the art could be used as well, such as LiPONB, $Li_{3.6}Si_{0.6}P_{0.4}O_4$, $Li_{6.1}V_{0.61}Si_{0.39}O_{5.36}$, $LiBO_2$, LiBP, $Li_2SO_4$—$Li_2O$—$B_2O_3$, $Li_2S$—$SiS_2$—$P_2S_5$, or LiI—$Li_2S$—$P_2S_5$—$P_2O_5$, etc. The electrolyte layer 24 serves to allow the free passage of ions between the self supporting ceramic cathode layer 23 and the anode layer 25 when the cathode layer 23 and anode layer 25 are connected through an external circuit.

Following formation of the electrolyte layer 24, an anode layer 25 is deposited onto the electrolyte layer 24. In a preferred embodiment of the current invention, the anode layer 25 is formed from lithium metal. Alternatively, other suitable materials such as lithium-carbon alloys, lithium-tin alloys, lithium-silicon alloys, lithium-germanium alloys, lithium-magnesium alloys, lithium-indium alloys, lithium-gallium alloys, $Li_xV_2O_5$, $V_2O_5$, Cu, $SiSn_{0.87}O_{1.20}N_{1.72}$ and SnO can be used for anode construction. An anodic current collector 26 is formed on the anode layer 25 in order to connect the anode layer 25 to an external circuit via the anodic circuit connection 27. Finally, in some embodiments of the present invention, an encapsulation layer 28 is deposited onto the electrochemical cell 20 to hermetically seal the electrochemical cell 20 from the intrusion of moisture. Thus, a self supporting electrochemical cell 20 of the present invention is constructed without a separate, supportive substrate material as taught by the prior art.

Figure 3:
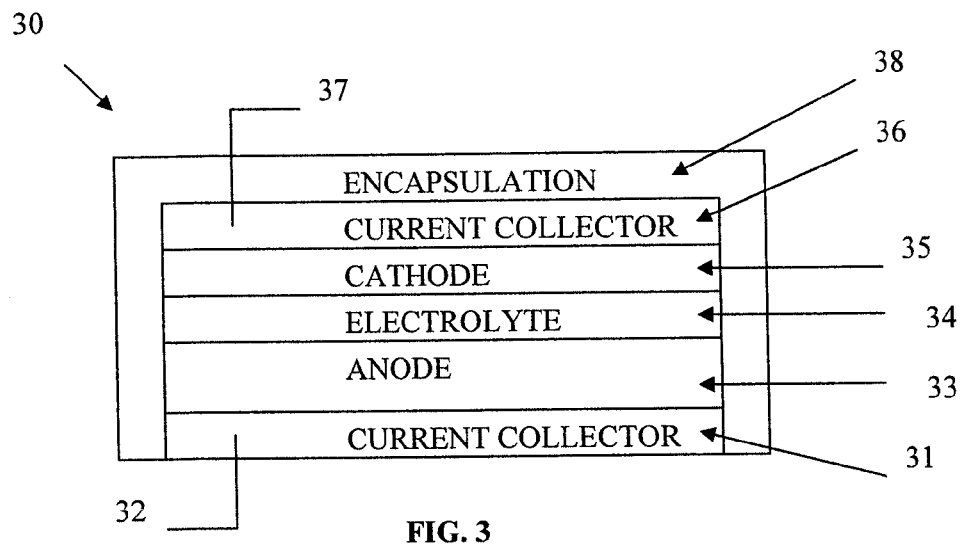
FIG. 3 is a cross sectional view of an electrochemical cell employing a self supporting anode as taught by the present invention.

In another embodiment of the present invention, an electrochemical cell is formed using a self supporting anode, similarly bypassing the need for a supportive substrate as taught by the prior art. FIG. 3 illustrates an electrochemical cell 30 employing a self supporting anode layer 33. In embodiments utilizing a self supporting anode layer 33, the anodic material is preferably made from a metal such as lithium, sodium, copper, silver or their alloys with other metals. An anodic current collector 31 and anodic circuit connection 32 are formed on one major surface of the self supporting anode layer 33. On the opposing major surface, a solid electrolyte layer 34 is fabricated. The material chosen for the solid electrolyte layer 34 will depend on the material utilized for the self supporting anodic layer 33; however, such electrolyte material should be chosen to ensure the flow of ions from the self supporting anodic layer 33 to the cathodic layer 35 when the anode layer 33 and cathode layer 35 are connected through an external circuit. Cathodic layer 35 is formed onto solid electrolyte layer 34 and should be comprised of a material which will achieve an intercalation reaction with the active ion of the cell (i.e., lithium, sodium, copper or silver ions, respectively). A cathodic current collector 36 is next formed onto the cathodic layer 35 followed by a cathodic circuit connection in order to connect the cathodic current collector to an external circuit. Finally, an encapsulation layer 38 is employed in some embodiments of the present invention to prevent the introduction of moisture into the electrochemical cell 30. The encapsulation layer 38 can be comprised of one or multiple applications of various encapsulation materials. For example, in a preferred embodiment silicon nitride can be used as an encapsulation material. Given the inherent properties of silicon nitride as are apparent to those skilled in the art, oftentimes a second material, such as silicon oxide, is applied over the silicon nitride to ensure that encapsulation layer 38 hermetically seals the cell 30. Other examples of materials which can be used as part of the encapsulation layer 38 include silicon oxynitride, parylene, polymers or metals.

Another embodiment of the present invention contemplates integrating the self supporting electrochemical cell taught with a solar cell in order to provide an integrated electrochemical and solar cell.

Figure 4:
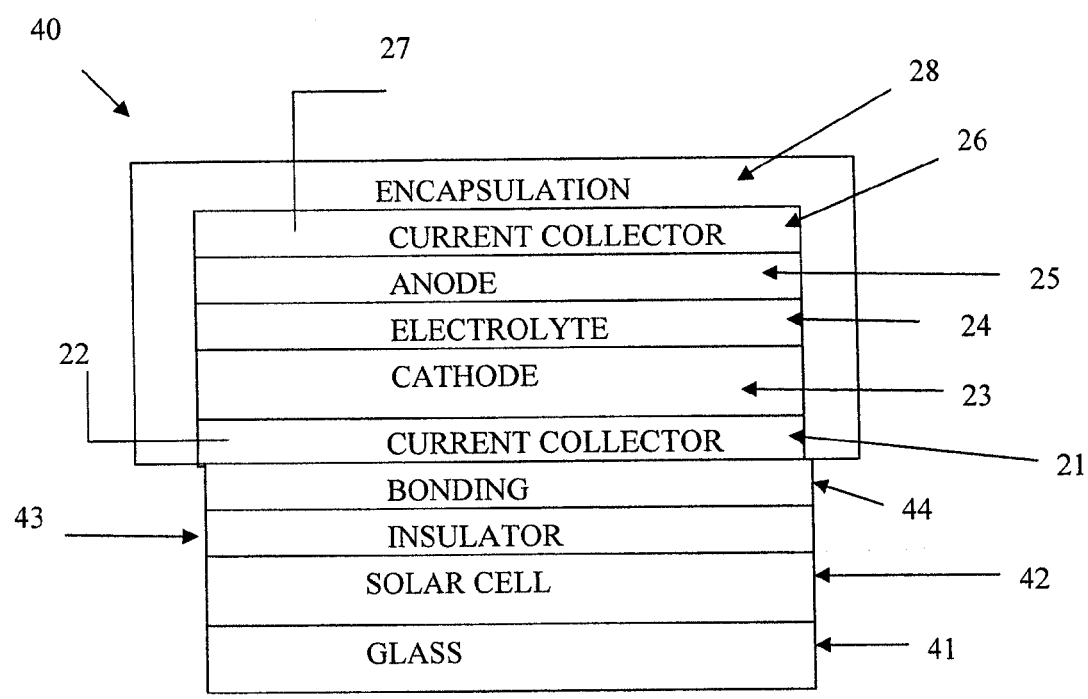
FIG. 4 is a cross sectional view of an integrated electrochemical and solar cell of the present invention.

FIG. 4 illustrates an embodiment of an integrated electrochemical and solar cell 40 as contemplated by the current invention. As used herein the term "solar cell" embraces any known device used for the purposes of converting solar radiation into electricity. Descriptions of solar cells which can be used with preferred embodiments of the present invention can be found, for example, in U.S. Pat. Nos. 6,309,906 and 4,740,431. In application of a preferred embodiment, a solar cell 42 is first formed onto a glass substrate 41 as is well known in the art. The glass substrate 41 is used to protect the solar cell 42 from damage as well as to add supportive strength to the fragile solar cell 42. An insulator layer 43 can then be fabricated onto the solar cell 42 in order to isolate the solar cell 42 materials from the current collector 21. Some examples of insulator layer materials are silicon nitride, silicon oxynitride, aluminum oxide and silicon dioxide. Additionally, the cathodic circuit connection 22 can be provided to connect the cathodic current collector 21 to an external circuit. Typically, the insulator layer 43 is relatively thin and non-supportive. In a preferred embodiment, the insulator layer 43 is joined to the cathodic current collector 21 via the application of a bonding 44. The bonding 44 can take the form of adhesion techniques such as semiconductor bonding technology, copper diffusion bonding, copper-tin-copper diffusion bonding or the like and can be accomplished in one or multiple layers or application steps to achieve the desired joining of the insulator layer 43 to the cathodic current collector 21. For example, in one embodiment, the bonding 44 can encompass the deposition of a thin copper layer onto the insulator layer 43 followed by a thin layer of tin. Copper can then be used as the cathodic current collector 21. When the copper cathodic current collector 21 is deposited into intimate contact with the tin layer of the bonding 44 and heated, the copper-tin-copper diffusion bonding process takes place resulting in a solid bond between the insulator layer 43 and the cathodic current collector 21 via the bonding 44. In one embodiment, following the fabrication of the cathodic current collector 21, and cathodic circuit connection 22, the self supporting electrochemical cell as outlined in FIG. 2 can then be fabricated onto the solar cell using fabrication techniques such as are appropriate for the materials chosen. In an alternative embodiment, the self supporting electrochemical cell as shown in FIG. 2 is fabricated separately from the solar cell 42 and glass 41 combination. The cathodic current collector 21 of the completed self supporting electrochemical cell 20 is then joined to the insulator layer 43 via a bonding 44 as previously outlined. In another embodiment, the solar cell 42 is joined to the cathodic current collector 21 with a glue serving as both the insulator layer 43 and the bonding 44.

Due to the self supporting nature of the ceramic cathode layer 23, the integrated electrochemical and solar cell 40 of the present invention can be fabricated efficiently as a complete package through the joining of components manufactured at different times or locations.

Figure 5:
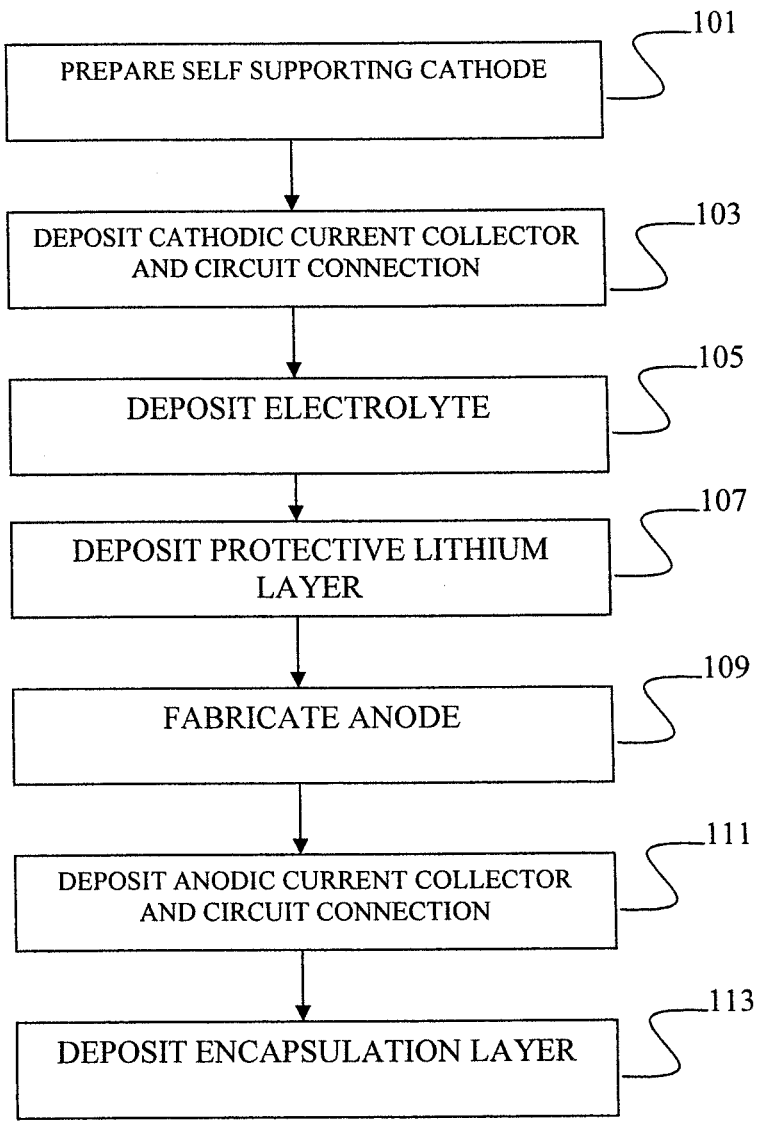
FIG. 5 is a flowchart of one embodiment of a fabrication process according to the teaching of the present invention.

A method for fabricating the integrated electrochemical and solar cell 40 will now be described with reference to FIGS. 5 through 9. The method described in FIG. 5 is directed toward the formation of the self supporting electrochemical cell as described herein and includes first preparing and fabricating a self supporting ceramic cathode (Step 101). In some embodiments, Step 101 includes adding electrolyte and/or conductive materials to the cathode material during preparation. In other embodiments, the cathodic material is mixed with the selected electrolyte and/or conductive materials and then subjected to various treatments such as hot isostatic pressing in order to ensure a dense cathode structure. A non-supportive cathodic current collector is applied to one major surface of the self supporting ceramic cathode material and cathodic circuit connections are prepared (Step 103).

In a preferred embodiment, following preparation and fabrication of the cathodic current collector and cathodic circuit connection, the electrolyte layer is deposited onto the opposing major surface of the self supporting cathode during Step 105. In a preferred embodiment, the electrolyte layer in Step 105 is deposited via sputtering, although other deposition techniques such as radio frequency sputtering, molecular beam deposition, atomic layer deposition, pulsed laser deposition, chemical vapor deposition, plasma enhanced chemical vapor deposition or ion beam assisted deposition can be utilized. In instances where a lithium-containing cathode material is selected, the method further includes the deposition of a protective layer of lithium via sputtering in Step 107 to protect the electrolyte-lithium interface. If desired and/or necessary, additional anodic material is added in Step 109, for example, clean lithium foil could be pressed into intimate contact with the protective lithium layer deposited in Step 107. The fabrication of the anodic current collector and anodic circuit connection occur in Step 111. Finally, to protect the electrochemical cell, an encapsulation layer can be deposited onto the cell in Step 113.

Figure 6:
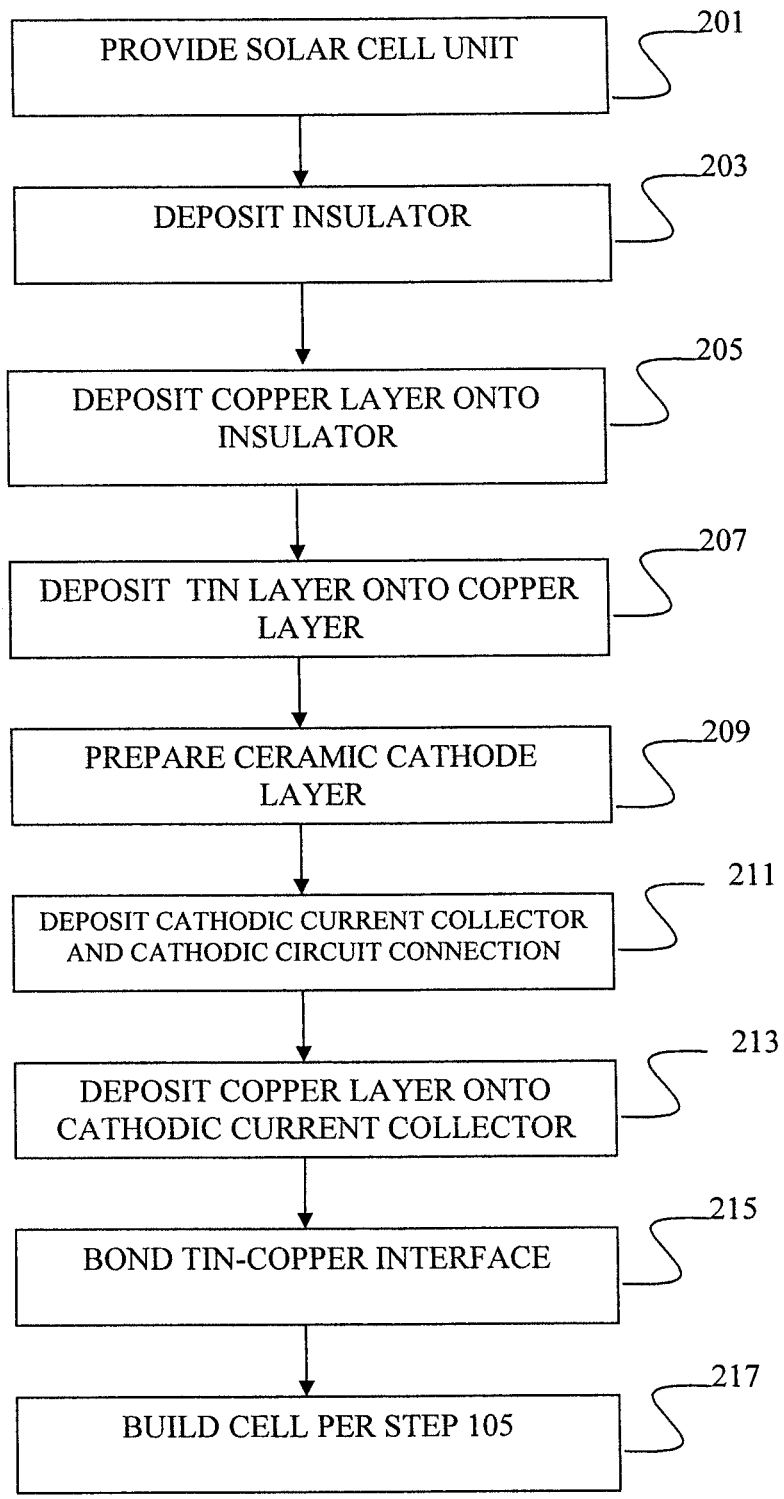
FIG. 6 is a flowchart of one embodiment of a fabrication process according to the teaching of the present invention.

Turning now to FIG. 6 a method of forming the integrated electrochemical and solar cell of the present invention is described using copper-tin-copper diffusion bonding to join the solar cell with the electrochemical cell. In step 201, a solar cell unit is provided. The solar cell unit is a combination of a glass substrate and solar cell as known in the prior art. In step 203, an insulation layer is deposited onto the solar cell material in order to insulate the solar cell material from the cathodic current collector. In Step 205, a copper layer is deposited onto the insulation layer. Next, in Step 207, a tin layer is deposited onto the copper layer. Additional steps (not shown) can be used to pattern the insulation, copper and tin layers in such a way so as to join multiple solar cells in series or in parallel to vary the voltage charging the electrochemical cell as taught by Little in U.S. Pat. No. 4,740,431. In Step 209, the ceramic self supporting cathode layer is prepared. In some embodiments, Step 209 includes adding electrolyte and/or conductive materials to the cathode material during preparation. In other embodiments, the cathodic material is mixed with the selected electrolyte and/or conductive materials and then subjected to various treatments such as hot isostatic pressing in order to ensure a dense cathode structure. A non-supportive cathodic current collector is applied to one major surface of the self supporting ceramic cathode material and cathodic circuit connections are prepared in Step 211. In Step 213, a copper layer is deposited onto the cathodic current collector. In Step 215, the copper layer deposited onto the cathodic current collector is bonded to the tin layer deposited in Step 207 via copper-tin-copper diffusion techniques as known in the art. Following Step 215, the electrochemical cell is built as previously instructed beginning with Step 105 of FIG. 5.

Figure 7:
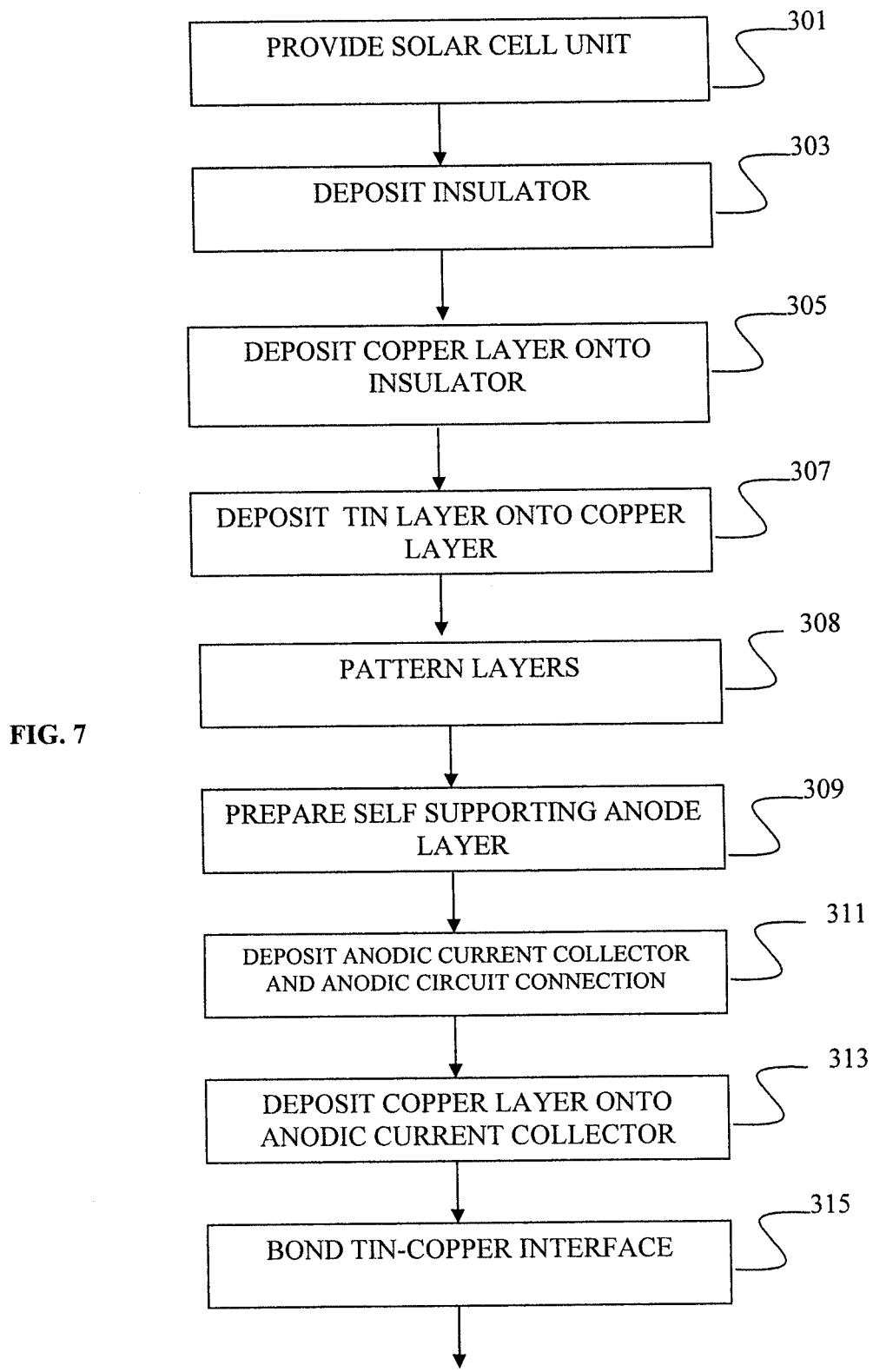
FIG. 7 is a flowchart of one embodiment of a fabrication process according to the teaching of the present invention.
Figure 7:
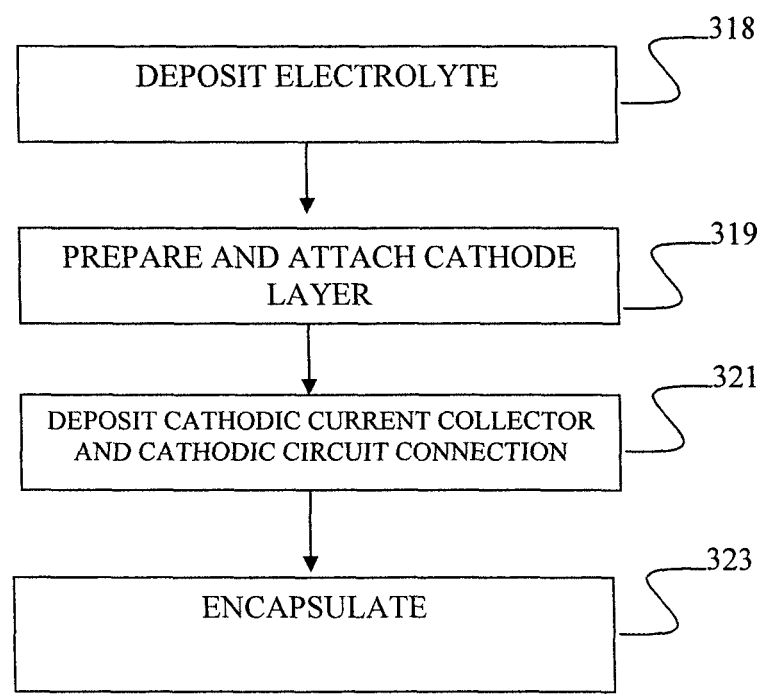

A method of fabricating an integrated solar and electrochemical cell utilizing a self supporting anode is described in FIG. 7. In Step 301, a solar cell as known in the prior art is provided. The solar cell typically comprises a glass substrate and layers of photovoltaic material. In Step 303, an insulator layer is deposited onto the photovoltaic material side of the solar cell. A copper layer is deposited onto the insulator layer in Step 305 followed by the deposition of a tin layer in Step 307. In optional Step 308, techniques can be used to pattern the insulation, copper and tin layers in such a way so as to join multiple solar cells in series or in parallel to vary the voltage charging the electrochemical cell as taught by Little in U.S. Pat. No. 4,740,431. In Step 309, a self supporting anode is provided. In a preferred embodiment, the self supporting anode of the present invention is selected from lithium, sodium, copper, silver or their alloys with other metals. In Step 311, the anodic current collector and anodic circuit connection are fabricated onto one of the two major surfaces of the self supporting anode. In Step 313, a copper layer is deposited onto the anodic current collector. In Step 315, the tin layer deposited in Step 307 and the copper layer deposited in Step 313 are bonded using copper-tin-copper diffusion bonding techniques. In the instance where copper is chosen as the anodic current collector material, Step 313 may be omitted. Next, in Step 318 the electrolyte layer is deposited onto the major face of the anode layer that is opposed to the anodic current collector. In Step 319, the cathodic material is prepared and joined onto the electrolyte layer. In some embodiments, Step 319 includes adding electrolyte and/or conductive materials to the cathode material during preparation. In other embodiments, the cathodic material is mixed with the selected electrolyte and/or conductive materials and then subjected to various treatments such as hot isostatic pressing in order to ensure a dense cathode structure. Next, in Step 321 the cathodic current collector and cathodic circuit connections are prepared and fabricated. Finally, in Step 323, at least the electrochemical cell portion of the device is encapsulated in order to prevent the introduction of moisture into the unit.

Figure 8:
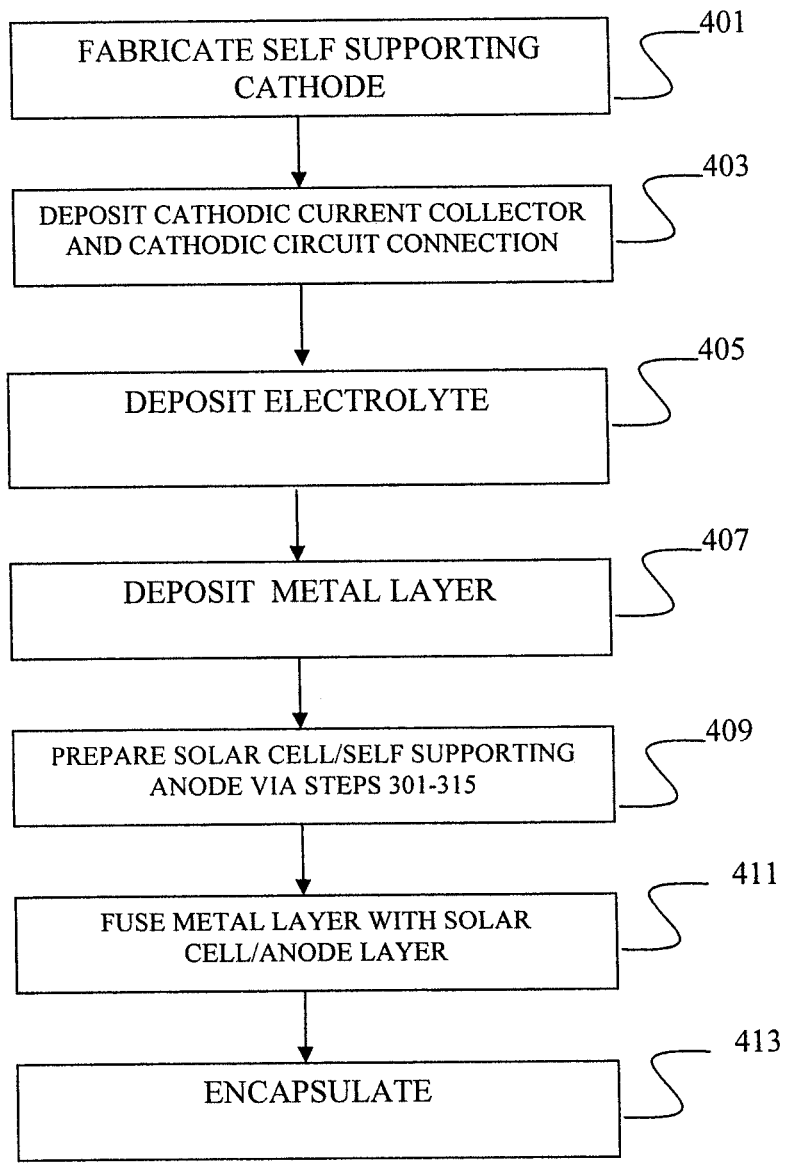
FIG. 8 is a flowchart of one embodiment of a fabrication process according to the teaching of the present invention.

FIG. 8 describes another embodiment of the present invention. In Step 401 a self supporting cathode layer is fabricated. In some embodiments, this includes adding electrolyte and/or conductive materials to the cathode material during preparation. In other embodiments, the cathodic material is mixed with the selected electrolyte and/or conductive materials and then subjected to various treatments such as hot isostatic pressing in order to ensure a dense cathode structure. Next, in Step 403, the cathodic current collector and cathodic circuit connections are prepared and fabricated on one major face of the cathode layer. On the opposing face of the self supporting cathode layer, a solid electrolyte layer is then deposited in Step 405. Next, in Step 407, a thin layer of the electrochemically active metal of the cell is deposited onto the electrolyte layer. In other embodiments, it is permissible to deposit a metal that is known to alloy with the electrochemically active metal of the cell. In other embodiments, it is permissible to deposit an alloy of the electrochemically active metal of the cell with another metal. Next, in Step 409, a solar cell/self supporting anode layer is fabricated according to Steps 301-315. The thin layer of metal deposited on the self supporting cathode-electrolyte layer in Step 407 is then placed in intimate contact with the exposed surfaced of the self supporting anode and heat and pressure are applied so as to fuse the cathode-electrolyte layer and solar cell/anode layers together in Step 411. This process is greatly facilitated if both mating surfaces are clean and smooth. Finally, at least the electrochemical cell portion of the device is encapsulated in Step 413 in order to prevent the introduction of moisture into the unit.

Figure 9:
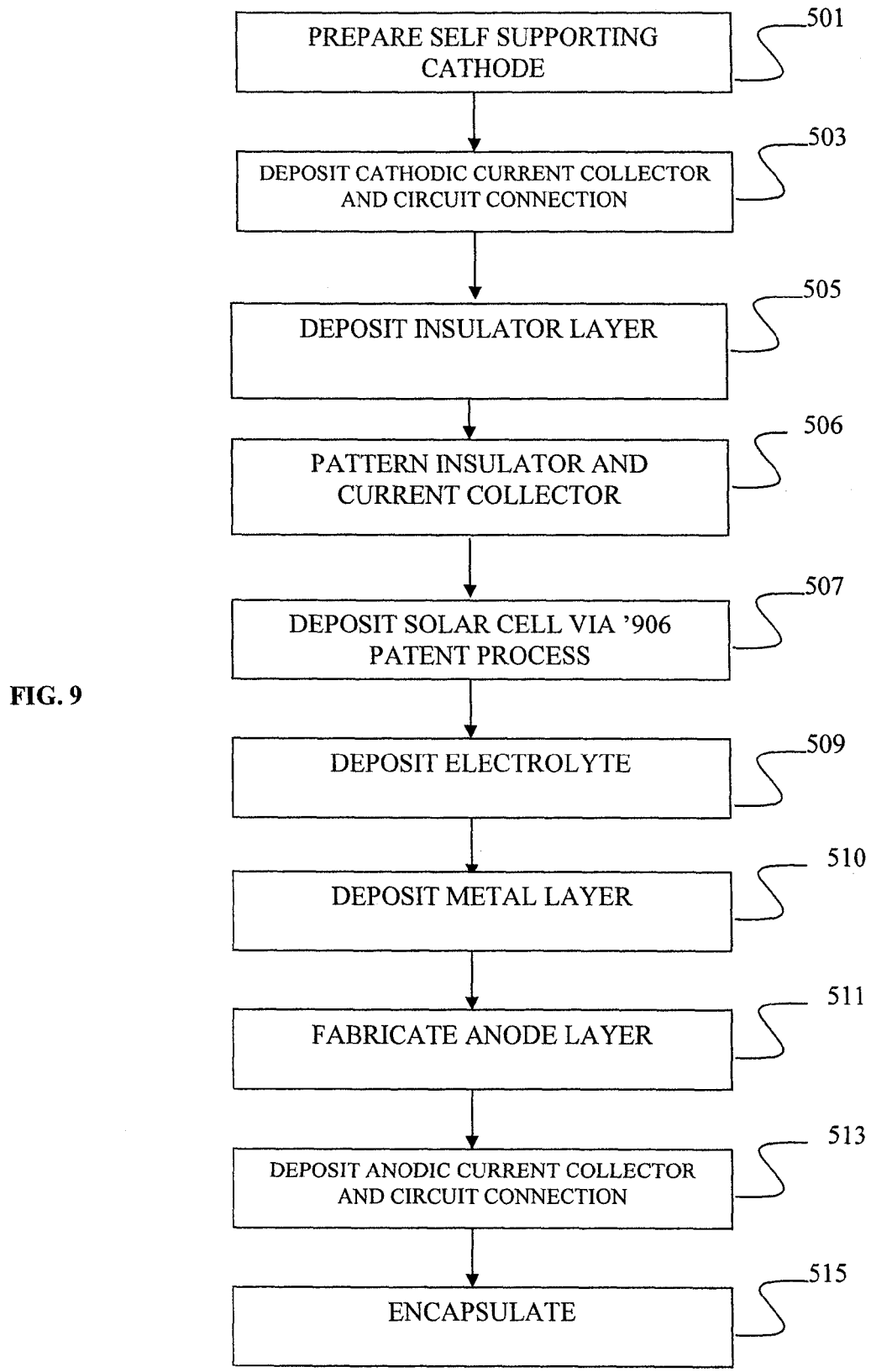
FIG. 9 is a flowchart of one embodiment of a fabrication process according to the teaching of the present invention.

FIG. 9 illustrates another method of manufacturing the integrated solar and electrochemical cell of the present invention. In this embodiment, the staging of the manufacturing steps is advantageous given that the heat involved in growing the solar cell would make the fabrication of the electrochemical cell difficult, especially when low melting materials like lithium or sodium are used for the anode. This embodiment has the added advantage that it allows fabrication of a thin-film solar cell directly onto the self supporting ceramic cathode, dispensing with the need for a glass substrate on which to deposit the thin-film solar cell and thereby saving cost and weight. In Step 501, a self supporting ceramic cathode is prepared. In some embodiments, Step 501 includes adding electrolyte and/or conductive materials to the cathode material during preparation. In other embodiments, the cathodic material is mixed with the selected electrolyte and/or conductive materials and then subjected to various treatments such as hot isostatic pressing in order to ensure a dense cathode structure. In Step 503, the cathodic current collector and cathodic circuit connection are deposited and fabricated onto one of the two major surfaces of the self supporting ceramic cathode. In Step 505 an insulator is deposited onto the cathodic current collector layer. If desired, in Step 506, etching or lift-off techniques can be used to pattern the insulation and metal layers in such a way so as to join multiple solar cells in series or in parallel to vary the voltage charging the electrochemical cell as taught by Little in U.S. Pat. No. 4,740,431. In Step 507, a photovoltaic solar cell is grown on the insulator layer via techniques as disclosed in U.S. Pat. No. 6,309,906. In Step 509, the electrolyte layer is deposited onto the second major surface of the self supporting ceramic cathode. In Step 510, a protective layer of metal can be deposited in order to protect the exposed surface of the electrolyte and ensure good interfacial contact between the electrolyte and the anode. The protective layer of metal chosen for Step 510 can be the electrochemically active metal (e.g., lithium, sodium, copper or silver), an alloy of the electrochemically active metal with another metal, or a metal (or metals) known to form alloys with the electrochemically active metal of the cell. In Step 511, the anodic layer is fabricated and attached to the cell, for example, by fusing the anode to the protective metal layer deposited onto the electrolyte in Step 510. In Step 513, the anodic current collector and anodic circuit connection are deposited and fabricated onto the anodic layer. Finally, an encapsulation layer is deposited in Step 515.

It is understood that the above description is intended to be illustrative and not restrictive. Although various characteristics and advantages of certain embodiments of the present invention have been highlighted herein, many other embodiments will be apparent to those skilled in the art without deviating from the scope and spirit of the invention disclosed. The scope of the invention should therefore be determined with reference to the claims contained herewith as well as the full scope of equivalents to which said claims are entitled.

Now that the invention has been described,

What is claimed is:

1. An integrated electrochemical and solar cell comprising:
an electrochemical cell comprising: a self-supporting ceramic cathode layer having a bottom surface and an upper surface, said self-supporting ceramic cathode layer having a thickness greater than 500 microns, said self-supporting ceramic cathode layer having no substrate layer; a non-supportive cathodic current collector being deposited onto said bottom surface of said self-supporting ceramic cathode layer; an insulator being deposited onto said non-supportive cathodic current collector; a solid electrolyte layer being deposited onto said upper surface of said self-supporting ceramic cathode layer; an anode layer being deposited onto said electrolyte layer; and an anodic current collector being deposited onto said anode layer;
wherein said self-supporting ceramic cathode layer is made from a lithium containing metal oxysulfide and said electrolyte to layer is made from $Li_{6.1}V_{0.61}Si_{0.39}O_{5.36}$; and
a solar cell electrically connected to said electrochemical cell, said solar cell being grown on said insulator layer; and
an encapsulation layer being deposited onto said integrated electrochemical cell.

2. An integrated electrochemical and solar cell comprising:
an electrochemical cell comprising: a self-supporting ceramic cathode layer having a bottom surface and an upper surface, said self-supporting ceramic cathode layer having a thickness greater than 500 microns, said self-supporting ceramic cathode layer having no substrate layer; a non-supportive cathodic current collector being deposited onto said bottom surface of said self-supporting ceramic cathode layer; an insulator being deposited onto said non-supportive cathodic current collector; a solid electrolyte layer being deposited onto said upper surface of said self-supporting ceramic cathode layer; an anode layer being deposited onto said electrolyte layer; and an anodic current collector being deposited onto said anode layer;
wherein said self-supporting ceramic cathode layer is made from a lithium containing metal oxysulfide and said electrolyte to layer is made from $LiI—Li_2S—P_2S_5—P_2O_5$; and
a solar cell electrically connected to said electrochemical cell, said solar cell being grown on said insulator layer; and an encapsulation layer being deposited onto said integrated electrochemical cell.

* * * * *